(12) United States Patent
Kawamata et al.

(10) Patent No.: US 8,888,932 B2
(45) Date of Patent: Nov. 18, 2014

(54) INDIUM-CONTAINING LEAD-FREE SOLDER FOR VEHICLE-MOUNTED ELECTRONIC CIRCUITS

(75) Inventors: Yuji Kawamata, Tochigi (JP); Minoru Ueshima, Matsudo (JP); Tomu Tamura, Kawanishi (JP); Kazuhiro Matsushita, Hamamatsu (JP); Masashi Sakamoto, Mino (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 12/452,665

(22) PCT Filed: Jul. 17, 2008

(86) PCT No.: PCT/JP2008/062932
§ 371 (c)(1),
(2), (4) Date: Aug. 11, 2010

(87) PCT Pub. No.: WO2009/011392
PCT Pub. Date: Jan. 22, 2009

(65) Prior Publication Data
US 2010/0307823 A1  Dec. 9, 2010

(30) Foreign Application Priority Data
Jul. 18, 2007 (JP) ................. 2007-187457

(51) Int. Cl.
*B23K 35/34* (2006.01)
*C22C 13/00* (2006.01)
*B23K 35/26* (2006.01)
*H05K 3/34* (2006.01)

(52) U.S. Cl.
CPC ............. *C22C 13/00* (2013.01); *B23K 35/26* (2013.01); *B23K 35/262* (2013.01); *H05K 3/3463* (2013.01)
USPC ............. 148/24; 148/400; 420/489; 420/499; 228/180.22; 228/248.1; 257/772

(58) Field of Classification Search
USPC ........ 420/489, 499; 148/24, 400; 228/180.22, 228/248.1; 257/772

IPC .......... B23K 35/26,35/262; C22C 13/00; H05K 3/3463

See application file for complete search history.

(56) References Cited

U.S. PATENT DOCUMENTS

| | | | |
|---|---|---|---|
| 4,901,137 A * | 2/1990 | Sato et al. ...................... | 257/712 |
| 2003/0015575 A1 | 1/2003 | Yamaguchi et al. ....... | 228/248.1 |
| 2003/0021718 A1 * | 1/2003 | Munekata et al. ............ | 420/560 |
| 2007/0071634 A1 * | 3/2007 | Huang et al. .................. | 420/560 |

FOREIGN PATENT DOCUMENTS

| | | | |
|---|---|---|---|
| EP | 1 273384 | | 1/2003 |
| JP | 05 228685 | | 9/1993 |
| JP | 09 155586 | | 6/1997 |
| JP | 09 326554 | | 12/1997 |
| JP | 10 193169 | | 7/1998 |
| JP | 10 314980 | | 12/1998 |
| JP | 11 221695 | | 8/1999 |
| JP | 2000 349433 | | 12/2000 |
| JP | 2001 504760 | | 4/2001 |
| JP | 2001 168519 | | 6/2001 |
| JP | 2001 334385 | | 12/2001 |
| JP | 2002-120085 | * | 4/2002 |
| JP | 2002 120085 | | 4/2002 |
| JP | 2002 307187 | | 10/2002 |
| JP | 2002 336988 | | 11/2002 |
| JP | 2003 039193 | | 2/2003 |
| JP | 2003 094195 | | 4/2003 |
| JP | 2004 122223 | | 4/2004 |
| JP | 2006 187788 | | 7/2006 |
| WO | 97 09455 | | 3/1997 |
| WO | 97 43456 | | 11/1997 |
| WO | 00 18536 | | 4/2000 |
| WO | 02 40213 | | 5/2002 |

* cited by examiner

*Primary Examiner* — Sikyin Ip
(74) *Attorney, Agent, or Firm* — Michael Tobias

(57) ABSTRACT

A lead-free solder alloy which can be used for soldering of vehicle-mounted electronic circuits and which exhibits high reliability is provided.
The alloy consists essentially of Ag: 2.8-4 mass %, In: 3-5.5 mass %, Cu: 0.5-1.1 mass %, if necessary Bi: 0.5-3 mass %, and a remainder of Sn. In is at least partially in solid solution in the Sn matrix.

10 Claims, No Drawings

INDIUM-CONTAINING LEAD-FREE SOLDER FOR VEHICLE-MOUNTED ELECTRONIC CIRCUITS

TECHNICAL FIELD

This invention relates to a lead-free solder for use under severe conditions having large temperature variations, such as a lead-free solder for use in an environment such as the vicinity of an automotive engine where there is a large temperature difference between periods when the engine is operating and periods when the engine is off. This invention also relates to a vehicle-mounted electronic circuit using the lead-free solder.

BACKGROUND ART

Due to the harmful effects of lead on the human body, the use of lead-containing solders is now regulated. For this reason, Sn-based, lead-free solders have become widely used. At present, Sn-3Ag-0.5Cu solder is much used as a lead-free solder in so-called household electronic equipment such as televisions, video cameras and decks, mobile telephones, and personal computers. This lead-free solder is somewhat inferior to conventional Pb—Sn solders with respect to solderability. However, as a result of improvements in flux and soldering apparatuses, it can now be used without problems, and it does not experience peeling or similar problems in ordinary use over the lifespan of household electronic equipment.

A heat cycle test is used to test the durability of soldered joints in household electronic equipment. In a heat cycle test which is widely used for household electronic equipment, chip resistor components measuring 3.2×1.6×0.6 mm are soldered to a printed circuit board, and a heating and cooling cycle in which soldered joints are held at a high temperature of +85° C. and then a low temperature of −40° C. for 30 minutes at each temperature is repeated for 500 cycles. Subsequently, the state of electrical conduction of the soldered joints is measured. The result is acceptable if conduction takes place.

Electronic circuits having electronic parts soldered to, i.e., mounted on a printed circuit board are also mounted on automobiles (such circuits are referred to below as vehicle-mounted electronic circuits). Heat cycle tests are also carried out on vehicle-mounted electronic circuits. A heat cycle test used for vehicle-mounted electronic circuits is carried out under extremely severe test conditions which, as described later, are far more severe than those of the heat cycle test for household electronic equipment.

There have been many proposals in the past of lead-free solders having excellent resistance to heat cycles. See Patent Documents 1-3.

However, none of them exhibited sufficient resistance to heat cycles when tested by a heat cycle test of the type which is currently required for soldered joints of vehicle-mounted electronic circuits.

Patent Document 1: JP 05-228685 A1
Patent Document 2: JP 09-326554 A1
Patent Document 3: JP 2000-349433 A1

DISCLOSURE OF INVENTION

Problem which the Invention is to Solve

None of the actual compositions disclosed in the examples of Patent Documents 1-3 provided satisfactory results when a heat cycle test was carried out for 500 heat cycles between −40° C. and +85° C. according to current standards demanded of household electronic equipment or when a heat cycle test was carried out for 1000 heat cycles between −55° C. and +150° C.

The resistance of solder to heat cycles cannot be evaluated by tests of bulk properties such as a tensile strength test, a creep test, or a fatigue test which are presently carried out. In order to evaluate the resistance of a soldered joint to heat cycles, it is thought to be necessary to carry out a heat cycle test on a printed circuit board actually having electronic parts mounted thereon. A heat cycle test for vehicle-mounted electronic circuits is more severe than a heat cycle test for household electronic equipment (which measures whether conduction takes place after 500 cycles of heating and cooling from −40° C. to +85° C.). Vehicle-mounted electronic circuits require a prescribed bonding strength for soldered joints in an extremely severe heat cycle test which performs at least 1000 cycles and preferably 2000 cycles of heating and cooling from −55° C. to +150° C. There are no conventional lead-free solders which can satisfy this requirement.

Some conventional lead-free solders having improved resistance to heat cycles which are disclosed in above-described Patent Documents 1-3 cause spontaneous deformation (self-deformation) when used in an environment having large variations in temperature. As a result, during the passage of a long period of time, bridges sometimes develop between adjoining conductors, and these bridges cause electronic equipment to malfunction.

Vehicle-mounted electronic circuits are used in equipment for electrically controlling engines, power steering, brakes, and the like. Since they have become extremely important components for maintaining safe operation of automobiles, they must be able to stably operate for long periods of time without malfunctioning. In particular, a vehicle-mounted electronic circuit for engine control is mounted in the vicinity of an engine and accordingly has a very severe environment of use. The vicinity of an engine where such a vehicle-mounted electronic circuit is installed is at a high temperature of 100° C. or above when the engine is operating, and when the engine stops, the temperature becomes the temperature of the outside air, which in frigid regions of North America or Siberia, for example, is a low temperature of −30° C. or below in winter. Accordingly, vehicle-mounted electronic circuits may be exposed to heat cycles from −30° C. or below to +100° C. or above during repeated operation and stopping of engines.

When a vehicle-mounted electronic circuit is placed for a long period in an environment having such large temperature variations (referred to below as a heat cycle environment), the solder and the printed circuit board of the circuit undergo thermal expansion and contraction. Since solder, which is made of metal, and a printed circuit board, which is made of a resin (such as a glass epoxy substrate), have different coefficients of thermal expansion from each other, stress is applied to both members. The printed circuit board which is made of resin does not experience any problems due to its ability to expand and contract, but expansion and contraction of metallic solder over a long period causes metal fatigue, and after the passage of a long period, cracks may develop and fracture of solder may occur.

Metal fatigue of solder occurs due to stresses applied over long periods. Therefore, even if a vehicle-mounted electronic circuit does not experience problems for a while immediately after the start of use of a new automobile, when the automobile has been operated for long periods, the solder in soldered joints may peel off. The cause of this peeling is that when a soldered joint is exposed to a heat cycle environment, its bonding strength decreases although not to the extent to cause fracture but to an extent sufficient to cause peeling of the solder due to large shocks applied by the road surface or continuous small vibrations applied by the engine while a vehicle is being driven.

Accordingly, solder for use in a vehicle-mounted electronic circuit needs to have excellent resistance to heat cycles in a heat cycle environment. When carrying out soldering of vehicle-mounted electronic circuits, it is desirable to use a lead-free solder of a Sn-3Ag-0.5Cu alloy which has already been used in household electronic equipment. However, this lead-free solder does not have sufficient resistance to heat cycles in a severe heat cycle environment, so it cannot be used in a severe heat cycle environment having an extremely large difference between high temperatures and low temperatures as encountered in an automobile.

A target of the present invention is to develop a solder alloy capable of withstanding 1000 heat cycles in a heat cycle test in which the temperature is maintained at −55° C. and +150° C. for 30 minutes at each temperature and which is currently considered to be sufficiently severe as a test for vehicle-mounted electronic circuits.

Solder used in vehicle-mounted electronic circuits must of course not only have excellent solderability but must also be capable of being soldered at a temperature which does not have thermal effects on electronic parts or printed circuit boards during soldering. In general, it is thought that a soldering temperature should be 10-30° C. above the liquidus temperature of solder. As the liquidus temperature of solder increases, the soldering temperature must also increase. However, if the soldering temperature is high, electronic parts and printed circuit boards undergo thermal damage or suffer a deterioration in performance. If the soldering temperature is 250° C. or lower when performing reflow soldering of electronic parts or printed circuit boards, electronic parts and printed circuit boards do not undergo thermal damage. Accordingly, assuming that a soldering temperature of 250° C. or lower is necessary, the liquidus temperature of solder should be 240° C. or lower and preferably 235° C. or lower.

For a solder used in a vehicle-mounted electronic circuit, it is also desirable to have a solidus temperature of at least 170° C. and preferably at least 180° C. This is because when an environment in which a solder joint is disposed reaches a high temperature, the closer is the high temperature to the solidus temperature of the solder, the weaker the bonding strength of the solder becomes. Namely, if a vehicle-mounted electronic circuit is disposed in the engine compartment, the engine compartment may become a high temperature exceeding 100° C. The solidus temperature of solder is more preferably at least 190° C., which is at least 90° C. higher than the temperature of the engine compartment.

It is also necessary for a solder for use in a vehicle-mounted electronic circuit that it do not undergo self-deformation (spontaneous deformation) in a heat cycle environment. If solder undergoes self-deformation, a solder joint causes short circuit failures by contacting an adjoining conductor (it causes bridging). This self-deformation is due not to external stresses but is due to transformation of the structure of the solder alloy.

An object of the present invention is to provide a lead-free solder which can be used for soldering of vehicle-mounted electronic circuits and which exhibits high reliability, as well as a vehicle-mounted electronic circuit in which the solder is used.

More specifically, the present invention provides a lead-free solder alloy for vehicle-mounted electronic circuits which exhibits excellent resistance when subjected to heat cycles of holding at −55° C. and +150° C. for 30 minutes at each temperature for 1000 cycles and preferably 2000 cycles without the penetration of cracks through a solder joint, and which does not exhibit deformation of a solder joint after elapse of 1000 heat cycles and preferably 2000 heat cycles. The present invention also provides a vehicle-mounted electronic circuit using the solder alloy.

Means for Solving the Problem

In general, it is thought that the resistance of solder to heat cycles is improved if an intermetallic compound is present in the solder matrix. As a result of diligent research by the present inventors concerning resistance to heat cycles of lead-free solders in which an intermetallic compound is present, it was found that the resistance to heat cycles greatly varies depending upon the shape, size, and distribution of the intermetallic compound. For example, if an intermetallic compound in the form of acicular crystals is present, when cracks develop, the acicular crystals suppress the propagation of the cracks since they act like reinforcing bars in reinforced concrete during continued use in a heat cycle environment. However, if the acicular crystals become spherical and coarsen to a size of around several micrometers, they no longer contribute to an improvement in resistance to heat cycles.

In addition, it was also found that in a heat cycle environment, if a crack develops in the solder of a soldered joint, crystals of an intermetallic compound which are present in the direction of propagation of the crack become spherical and coarse due to the stresses applied by the crack. The coarsened intermetallic compound can no longer suppress the propagation of cracks.

The mechanism by which fine acicular crystals of $Ag_3Sn$ and $Cu_6Sn_5$, which are intermetallic compounds formed in the Sn matrix of Sn based lead-free solder containing Ag and Cu, coarsen to form granular crystals will be briefly explained.

When $Ag_3Sn$ and $Cu_6Sn_5$ are in a fine crystalline state, the area of the interface of these intermetallic compounds with the Sn matrix is extremely large, so they are in a state in which the sum of their interfacial energy is extremely high. On the other hand, as a reaction progresses as a natural phenomenon from a high energy state to a low energy state, the area of the interface between $Ag_3Sn$ or $Cu_6Sn_5$ and the Sn matrix becomes smaller. Namely, these intermetallic compounds change from fine acicular crystals into large spherical crystals. This coarsening of intermetallic compounds easily occurs at a high temperature in a heat cycle environment. As this change progresses, the intermetallic compounds can no longer be expected to provide the effect of improving resistance to heat cycles. Incidentally, coarsening of intermetallic compounds scarcely takes place at the tip of a fillet where it is relatively difficult for stresses to be applied, while coarsening is pronounced in joint portions such as the bottom of chip parts where stresses concentrate. When cracks develop, spheroidization and coarsening of intermetallic compounds occur in the direction of propagation of cracks, and the coarsened intermetallic compounds can no longer stop the propagation of cracks.

Since conventional lead-free solders which were considered to have excellent resistance to heat cycles can not satisfy the higher reliability requirements of a vehicle-mounted electronic circuit, the present inventors carried out heat cycle tests on printed circuit boards on which vehicle-mounted electronic circuits were actually mounted using various solders, and they evaluated the various solders by measuring the bonding strength of solder joints after a heat cycle test. As a result, they found an alloy composition which could effectively suppress a deterioration in bonding strength in a heat cycle environment and thereby completed the present invention.

The present invention is a lead-free solder which is an Sn—Ag—Cu based alloy containing a solid solution element such as In (indium). According to the present invention, the amount of a solid solution element which is present in solid solution state does not substantially vary between room temperature and high temperatures. Therefore, in a heat cycle environment, solid solution strengthening can be maintained not only at room temperature but also at high temperatures, and the amount of solid solution does not depend upon the heat cycle environment, resulting in an alloy structure which is not affected in strength by temperature or thermal history. Accordingly, with a solder alloy according to the present invention, a deterioration in strength in a heat cycle environment is suppressed and resistance to heat cycles is improved.

The present invention is as follows.

(1) A lead-free solder for vehicle-mounted electronic circuits characterized by consisting essentially of Ag: 2.8-4 mass %, In: 3-5.5 mass %, Cu: 0.5-1.1 mass %, and a remainder of Sn, wherein the In is present at least partially in solid solution in an Sn matrix.

(2) A lead-free solder as set forth above in (1) characterized by consisting essentially of Ag: 3-3.5 mass %, In: 4.5-5.5 mass %, Cu: 0.8-1.0 mass %, and a remainder of Sn.

(3) A lead-free solder as set forth above in (1) further containing Bi: 0.5-3 mass % in place of a portion of Sn.

(4) A lead-free solder as set forth above in (2) characterized by consisting essentially of Ag: 2.8-3.5 mass %, In: 4.0-5.5 mass %, Cu: 0.8-1.0 mass %, Bi: 0.5-1.5 mass %, and a remainder of Sn.

(5) A lead-free solder as set forth above in (2) characterized by consisting to essentially of Ag: 2.8-3.5 mass %, In: 3.0-4.0 mass %, Cu: 0.8-1.0 mass %, Bi: 1.5-3 mass %, and a remainder of Sn.

(6) A lead-free solder as set forth above in any of (1) through (5) characterized by containing a total of 0.005-0.05 mass % of at least one element selected from the group consisting of Ni, Fe, and Co in place of a portion of Sn.

(7) A lead-free solder as set forth above in any of (1) through (6) characterized by further containing at least one of P and Ge in a total amount of 0.0002-0.02 mass % in place of a portion of Sn.

(8) A lead-free solder as set forth above in any of (1) through (7) characterized by further containing at most 1 mass % of Zn in place of a portion of Sn.

There are no particular limitations on the mode of use of a solder alloy according to the present invention. It can be used for flow soldering in which the solder is used in a molten state or for reflow soldering in which the solder is used as a solder paste by being mixed with a suitable flux. It can also be used as rosin-core solder for soldering with a soldering iron, or as a solder preform having a shape such as a pellet, a ribbon, or a ball. However, it is preferably used as a solder paste.

A vehicle-mounted electronic circuit according to the present invention is an electronic circuit incorporated into the central computer of a so-called automotive electronic control unit which, as described above, electrically controls the engine output, the brakes, or the like. A specific example of the circuit is a power module or a hybrid semiconductor electronic circuit.

Effects of the Invention

A lead-free solder according to the present invention has a composition having excellent resistance to heat cycles. In a heat cycle environment, further improvement in resistance to heat cycles can be achieved by the effect of In or the like which is dissolved in an Sn matrix to form solid solution under both high-temperature conditions and low-temperature conditions and if the composition contains Bi, in addition to the above effect, by the effect of fine precipitates of Bi formed from a supersaturated solid solution.

When a lead-free solder according to the present invention is disposed in a heat cycle environment for a prolonged period of time, even after intermetallic compounds having fine acicular crystals become intermetallic compounds having coarse spherical crystals so that suppression of the spread of cracks can no longer be achieved by the intermetallic compounds, the spread of cracks can be prevented due to the presence of a solid solution of In or the like. Furthermore, if the alloy contains Bi, in addition to the above effect, Bi which is precipitated from a Bi supersaturated solid solution is dispersed in the alloy, thereby allowing the matrix itself to exhibit good resistance to heat cycles. Therefore, stable reliability can be achieved over a long period.

In addition, as a lead-free solder according to the present invention does not undergo self-deformation when it is disposed in a severe heat cycle environment, it does not form bridges.

A lead-free solder according to the present invention contains In and optionally Bi, which both lower the liquidus temperature of an Sn—Ag—Cu alloy, in suitable amounts, namely, in amounts which do not excessively lower the solidus temperature of the alloy. Therefore, soldering can be carried out under the same conditions as for an Sn-3Ag-0.5Cu lead-free solder which is predominantly used for soldering of present-day electronic equipment. As a result, not only can existing soldering equipment be used, but the advantage is obtained that soldering has little thermal effect on electronic parts.

The primary function of a power module or a hybrid semiconductor circuit having a ceramic substrate or a metal substrate is converting the voltage, the current, or the frequency of an input power supply. The input power supply is a high-power lithium ion battery, a lead-acid battery which is used in automobiles or motorcycles, power generation by a motor in an automobile or an electric train, a power line, or a household power supply from 100 to 220 volts. The power from these input power supplies can be converted to drive the motor of a drive portion or to illuminate headlights, such as the headlights of an automobile, which require a large amount of electric power. Alternatively, electricity which is generated by electromagnetic coils at the time of motor braking is converted so as to charge a lithium battery or a lead-acid battery. Therefore, a large amount of heat is generated within such a circuit. Chip parts such as resistors and capacitors which are essential in forming these electronic circuits are of large size, such as 3216 parts. Therefore, with these electronic circuits, joints of the circuits with a printed circuit board are easily destroyed by heat cycles.

A power module, which is used in power supply circuits and the like, is an electronic circuit which employs one or more power transistors. Cooling fins are often disposed on a power module. Because power modules carry large currents, they have thick wiring and a large joint area.

Hybrid semiconductor circuits, which are also referred to as hybrid integrated circuits, have semiconductor chips mounted on a ceramic substrate having wiring, resistors, capacitors, and the like formed thereon. Such an electronic circuit belongs to the preceding generation of integrated circuits, but since an integrated circuit using a silicon wafer has the drawback of poor heat resistance, hybrid semiconductor circuits which can carry large currents and have good heat resistance are still used for mounting on vehicles. Such hybrid semiconductor circuits use large-sized chip parts.

The present invention provides a vehicle-mounted electronic circuit which is optimal for the above-described power modules and hybrid semiconductor circuits.

In the present invention, "excellent resistance to heat cycles" means that when a force in the horizontal direction is applied from the side to chip resistors on a printed circuit board in a bonding test machine after the above-described heat cycle test until the chip resistors are peeled off, the average (peeling) strength is at least 20 N (Newtons) with the minimum strength value being at least 15 N.

In a heat cycle test according to the present invention, a lead-free solder paste is applied by printing to a thickness of 150 μm to patterned portions to be soldered (each 1.6×1.2 mm) of a printed circuit board, chip resistor parts measuring 3.2×1.6×0.6 mm are mounted thereon, soldering is performed in a reflow furnace with a peak temperature of 245° C., and then the printed circuit board having the chip resistor parts mounted thereon is subjected to 1000 cycles and 2000 cycles, with each cycle is holding for 30 minutes at each of −55° C. and +150° C.

BEST MODE FOR CARRYING OUT THE INVENTION

The technical significance of the addition of In (indium) in the present invention is as follows.

An Sn—Ag—Cu based alloy according to the present invention has a structure which is formed from a β-Sn dendrite structure and an Sn—Ag—Cu eutectic structure. The Sn—Ag—Cu eutectic structure has fine acicular crystals of $Ag_3Sn$ dispersed therein, so it has a high strength. However, a β-Sn dendrite structure has the same strength as pure Sn, so its mechanical strength is very low. In is dissolved in β-Sn to form a solid solution and thus can improve the mechanical properties of the β-Sn dendrite structure itself. Indium is also dissolved in β-Sn itself which forms a eutectic structure with acicular intermetallic compounds such as $Ag_3Sn$ and $Ag_2In$ and serves to improve the mechanical properties of the eutectic structure itself.

When In is added to an Sn—Ag—Cu alloy, it easily forms intermetallic compounds with Ag or Cu. Therefore, if it is added in a small amount, In cannot exhibit its solid solution strengthening effect on β-Sn. Thus, when around 1 mass % of In is added, it is consumed to form intermetallic compounds with Ag or Sn, and little is dissolved in β-Sn to form a solid solution. Accordingly, in order to obtain a solid solution strengthening effect, In is added in an amount of at least 3 mass %.

On the other hand, if more than 6 mass % of In is added, β-Sn is transformed into γ-Sn—In at a high temperature of 150° C., and in a heat cycle environment, the solder deforms by itself without the application of external stress. This deformation becomes more marked when the volume of solder is small. Therefore, with present-day mounting techniques which employ an increasingly small pitch, when soldering is carried out with a lead-free solder containing more than 6 mass % of In, fine solder powder remaining between electrodes or solder in fine soldered joints deforms in a heat cycle environment after mounting, leading to short circuits occurring between adjoining electrodes.

Taking into consideration resistance to heat cycles, the upper limit on the In content is 5.5 mass %.

Accordingly, in the present invention, the content of In is at most 5.5 mass %. With such an In content, even at 150° C., β-Sn is not transformed into γ-Sn—In, and at most around 4 mass % of In is dissolved to form a solid solution in β-Sn dendrites or in the β-Sn in an Sn—Ag—Cu eutectic structure. As a result, resistance to heat cycles is improved.

In the present invention, the content of In is 3-5.5 mass % and preferably 4.5-5.5 mass %. When Bi is added, the In content is 4.0-5.5 mass % or 3.0-4.0 mass % depending on the Bi content.

Thus, according to the findings of the present inventors, if a solid solution of Sn and In is formed, the resistance of a lead-free solder to heat cycles is improved. Namely, in a solid solution, solute atoms penetrate into stable positions in the crystal lattice of a solvent metal, or atoms of the solvent and the solute mutually replace their positions in common crystal lattice points. With a solid solution in the present invention, since the solvent atoms (Sn) and the solute atoms (In) differ from each other in size, they cause strains and hardens the solder, thereby improving resistance to heat cycles.

According to further findings of the present inventors, with a solder alloy in which a fine intermetallic compound is present in the Sn matrix and In dissolves in the Sn matrix to form a solid solution, due to a synergistic effect of the intermetallic compound and the solid solution, resistance to heat cycles is further improved.

By the presence of In which forms a solid solution in the Sn matrix, even if a vehicle-mounted electronic circuit is exposed to a heat cycle environment as described above so that an intermetallic compound in a lead-free solder is spheroidized to a large extend and no longer provides the effect of suppressing cracks, cracks can be prevented from propagating by the solid solution strengthening effect of In.

If an excessive amount of In is added, as described above, γ-Sn—In is formed, and in a heat cycle environment, the solder undergoes self-deformation. On the other hand, if the added amount of In is small, solid solution strengthening cannot be expected.

Accordingly, when a member which is soldered with an Sn-based lead-free solder is placed in a heat cycle environment, if intermetallic compounds are present in the Sn matrix and In is at least partially dissolved therein to form a solid solution, due to a synergistic effect of these, excellent resistance to heat cycles can be maintained in the initial period of use. When the member is disposed in a heat cycle environment for a long period, fine acicular intermetallic compounds become intermetallic compounds having large spherical crystals, which can no longer prevent cracks from propagating. In such conditions, even if cracks develop in the solder of soldered joints, the matrix in which In is dissolved as a solid solution suppresses the propagation of the cracks, so the lifespan of soldered joints is elongated until the soldered joints completely peel off.

As a result, because a lead-free solder according to the present invention has

In dissolved as a solid solution in an Sn matrix, it can maintain excellent resistance to heat cycles even when disposed in an extremely severe heat cycle environment having exposure to a high temperature of 150° C. and a low temperature of −55° C. for 30 minutes at each temperature for 1000 cycles or 2000 cycles, which is far more severe than a heat cycle environment to which household electronic equipment is exposed.

Ag contributes to an increase in resistance to heat cycles by forming the intermetallic compound $Ag_3Sn$ with Sn. Furthermore, at the time of soldering, Ag provides good wettability to wet portions being soldered, and it also has the effect of decreasing the liquidus temperature of Sn. If Ag is added in an amount of less than 2.8 mass %, it has no effect on improving resistance to heat cycles. On the other hand, if it is added in excess of 4 mass %, an improvement in resistance to heat cycles and wettability corresponding to the amount which is added cannot be expected, and in addition, the liquidus temperature increases and solderability worsens. Furthermore, addition of a large amount of expensive Ag is not desirable from the standpoint of economy.

Accordingly, in the present invention, the Ag content is 2.8-4 mass % and preferably 3-3.5 mass %. When Bi is added, the Ag content is preferably 2.8-3.5 mass %.

The technical significance of the addition of Ag will be further explained.

The addition of Ag to an Sn—Ag—Cu based alloy or an Sn—Ag—Cu—In based alloy forms fine acicular intermetallic compounds such as $Ag_3Sn$, $Ag_2In$, and $AgIn_2$ and thereby increases the strength of the solder alloy. The addition of Ag can also serves to lower the melting temperature of Sn by around 20° C. It has a greater effect of lowering the melting temperature than does addition of the same amount of In. With an Sn—Ag—Cu based alloy, when Ag is added in an amount of around 3 mass %, the melting temperature becomes nearly the eutectic temperature. On the other hand, in regards to the alloy structure, even when the Ag content is 3 mass %, a eutectic structure comprises around 50% of the overall structure, and the majority of the structure is a $\beta$-Sn dendrite structure. With respect to the mechanical properties of an alloy on a microscopic level, a eutectic structure requires a large force for deformation because the movement due to dislocations is constrained by $Ag_3Sn$. However, a $\beta$-Sn dendrite structure allows movement due to dislocations to the same extent as pure Sn does, and an effect of increasing strength cannot be expected.

In a situation in which cracks locally propagate as observed in a heat cycle environment, cracks selectively extend in portions having a low strength. Therefore, if $\beta$-Sn dendrites are present too much, the resistance to heat cycles decreases. Thus, if the amount of Ag is too small, the proportion of $\beta$-Sn dendrites increases, and resistance to heat cycles can no longer be maintained, and in addition, a decrease in the liquidus temperature cannot be expected. Therefore, the amount of Ag which is added is at least 2.8 mass %. As the amount of Ag is increased, the amount of a $\beta$-Sn dendrites decreases. Although it depends on the Cu content, almost all of the $\beta$-Sn dendrite structures becomes an Sn—Ag—Cu eutectic structure when around 4 mass % of Ag is added. However, if Ag is added in a larger amount, the liquidus temperature ends up increasing, so addition of more than 4 mass % Ag is not desirable. The addition of an excessive amount of Ag also causes the formation of coarse $Ag_3Sn$, leading to a decrease in reliability.

Cu is necessary in order to prevent Cu wiring on a mounted substrate or Cu electrodes of electronic parts from dissolving into molten solder. In usual soldering, soldered joints are melted a plurality of times, and in a repair process, the temperature of soldered joints becomes higher than during ordinary soldering. As a result, Cu erosion occurs in which Cu on a substrate or electronic part is dissolved into molten solder. In particular, with a Sn based lead-free solder, Cu tends to rapidly dissolve so as to cause erosion of Cu on a substrate or a part.

When a semiconductor element or a ceramic substrate is plated with Ni and the plating thickness of Ni is small, severe dissolving of Ni takes place when soldering is carried out with a Sn based lead-free solder. As a result, the metal underneath the Ni plating is exposed, and the Ni plating can no longer function as a barrier layer. Particularly, vehicle-mounted electronic circuits are installed in equipment which is important for safety, and it is necessary to completely prevent disconnection of wires or a decrease in the performance of parts. For this reason, it is important to prevent Cu erosion of electrodes in portions to be soldered.

In order to prevent Cu erosion of vehicle-mounted electronic circuits, at least 0.5 mass % of Cu is added. However, addition of Cu in excess of 1.1 mass % causes the liquidus temperature to exceed 240° C., and the soldering temperature must be increased so that electronic parts and printed circuit boards end up undergoing thermal damage. Cu also has the effect of suppressing a deterioration in strength in a heat cycle test. In particular, with a solder in which Bi is not added and the amount of In is smaller than 4.5 mass %, for example, if the amount of Cu is less than 0.8 mass %, the reliability achieved may not satisfy the standards for vehicle-mounted electronic circuits.

Accordingly, in the present invention, although the Cu content is 0.5-1.1 mass %, it is preferably 0.8-1.0 mass %. In this case, the In content is preferably 4.5-5.5 mass %. When Bi is added, the preferred range for In varies in accordance with the amount of Bi.

Namely, with an alloy having a composition close to that of an Sn—Ag—Cu eutectic alloy, even when the same amount of Ag is added, the proportion of $\beta$-Sn which is present in the alloy greatly varies depending on the amount of Cu, and the addition of Cu results in the formation of a eutectic structure in which $Ag_3Sn$, $Cu_6Sn_5$, and $\beta$-Sn are simultaneously crystallized out, leading to a further improvement in resistance to heat cycles. As the proportion of $\beta$-Sn dendrites decreases, the area in the alloy where the strength is locally extremely low decreases, so resistance to heat cycles is improved. The eutectic structure in which $Ag_3Sn$, $Cu_6Sn_5$, and $\beta$-Sn are simultaneously crystallize out has the effect of improving the mechanical properties of the eutectic structure itself. On the other hand, excessive addition of Cu not only increases the liquidus temperature, but also forms coarse $Cu_6Sn_5$, which is unrelated to the eutectic structure, thereby causing a decrease in reliability.

On the other hand, when the amount of Cu which is added is small, taking into consideration the thermal history involved in a repair process or in reflow soldering or flow soldering carried out a plurality of times, erosion of Cu on a substrate or on electrodes may result in disconnection of Cu wiring in portions connected by solder due to a heat cycle environment or vibrations or the like. It is important for solder joints to have a high strength, but in evaluating the reliability of vehicle-mounted electronic circuits, it is important for the final product not to have conduction defects. Unless one takes into consideration disconnection of wires at various electrodes containing Cu, it is unsuitable as a solder alloy for vehicle-mounted electronic circuits.

In the present invention, a solder alloy may contain Bi such that the Bi content is 0.5-3 mass % and preferably 0.5-1.5 mass % or 1.5-3 mass %.

By adding an amount of Bi in the above-described range to an Sn—Ag—Cu—In alloy according to the present invention, the alloy has further improved resistance to heat cycles, and the solderability of the In-containing lead-free solder, which is relatively susceptible to oxidation, is improved. In addition, the melting temperature of the alloy is lowered. On the other hand, as the addition of both Bi and In may cause the melting temperature to extremely decrease, it is necessary to adjust the amount of Bi which is added in accordance with the amount of In. The coexistence of Bi and In tends to cause segregation. Taking into consideration heat resistance at a high temperature such as 125° C. or 150° C., it is necessary to maintain a solidus temperature of at least 190° C.

In a preferred embodiment of the present invention, when the In content is 3.0-4.0 mass %, the Bi content is 1.5-3 mass %, and when the In content is 4.0-5.5 mass %, the Bi content is 0.5-1.5 mass %.

In the present invention, at least one of Ni, Fe, and Co in a total amount of 0.005-0.05 mass % can be added with the object of further improving resistance to heat cycles and improving other properties such as the mechanical strength of the solder itself and the ability to suppress copper erosion. Within this range, one or more of these elements may be added. If the total amount of these optional elements is less than 0.005 mass %, the effect of improving the above-described properties is not obtained, while if their total amount exceeds 0.05 mass %, the liquidus temperature of the alloy ends up exceeding 240° C.

In the present invention, at least one of P, Ge, and Ga in a total amount of 0.0002-0.02 mass % may be added in order to prevent oxidation of solder and suppress discoloration. Within this range, one or more these elements may be added. If the total amount of these optional elements is smaller than 0.0002 mass %, the effect of preventing oxidation is not obtained, while if they are added in excess of 0.02 mass %, they worsen solderability.

Although Zn undergoes severe oxidation, it increases reactivity with metal and improves solderability in an inert atmosphere. However, if too much Zn is added to an Sn—Ag—Cu—In alloy, it increases the liquidus temperature of the alloy, so the content of Zn in the alloy is preferably at most 1 mass %.

Examples

In these examples, the alloys having the compositions shown in Table 1 were prepared and their properties were evaluated as summarized below.

The compositions of lead-free solders of examples of the present invention and comparative examples are shown in Table 1.

TABLE 1

| | | Alloy composition (mass %) | | | | | m.p. (° C.) *1 | | Bonding strength after heat cycle test (N) *2 | | | | Solder deformation | Cu erosion | |
|---|---|---|---|---|---|---|---|---|---|---|---|---|---|---|---|
| | | | | | | | Solidus Temp. | Liquidus Temp. | 1000 cycles | | 2000 cycles | | | | |
| | | Sn | In | Bi | Ag | Cu | Other | | | Av. | Min. | Av. | Min. | *3 | *4 | Remarks |
| Ex. | 1 | rem | 3 | | 3 | 0.5 | | 207 | 214 | 30.2 | 23.9 | 18.4 | 12.8 | No | No | ≥1000 cycles |
| | 2 | rem | 3 | 0.5 | 3 | 0.5 | | 202 | 213 | 31.0 | 24.0 | 19.0 | 12.9 | No | No | ≥1000 cycles |
| | 3 | rem | 3 | | 3 | 0.8 | | 207 | 220 | 37.2 | 31.2 | 23.6 | 18.0 | No | No | ≥1000 cycles |
| | 4 | rem | 3 | 2 | 3 | 1 | | 194 | 221 | 45.2 | 30.2 | 32.1 | 20.1 | No | No | ≥2000 cycles |
| | 5 | rem | 3 | 3 | 3 | 1 | | 190 | 219 | 48.0 | 33.1 | 32.4 | 22.1 | No | No | ≥2000 cycles |
| | 6 | rem | 4 | | 3 | 0.5 | | 206 | 213 | 36.0 | 25.0 | 22.7 | 13.6 | No | No | ≥1000 cycles |
| | 7 | rem | 4 | 0.5 | 3 | 0.5 | | 202 | 212 | 35.0 | 25.0 | 22.0 | 13.6 | No | No | ≥1000 cycles |
| | 8 | rem | 4 | | 3 | 0.8 | | 206 | 219 | 46.8 | 35.0 | 31.4 | 21.0 | No | No | ≥2000 cycles |
| | 9 | rem | 4 | 2 | 3 | 1 | | 191 | 217 | 49.6 | 35.0 | 33.7 | 21.0 | No | No | ≥2000 cycles |
| | 10 | rem | 5.5 | | 3 | 0.5 | | 198 | 208 | 43.7 | 32.5 | 33.1 | 18.6 | No | No | ≥1000 cycles |
| | 11 | rem | 5 | 0.5 | 3 | 0.5 | | 202 | 209 | 40.0 | 31.2 | 30.5 | 19.6 | No | No | ≥1000 cycles |
| | 12 | rem | 5 | | 3 | 0.8 | | 202 | 217 | 51.3 | 40.6 | 35.2 | 25.6 | No | No | ≥2000 cycles |
| | 13 | rem | 5 | 1 | 3 | 1 | | 199 | 216 | 54.0 | 41.3 | 37.6 | 26.2 | No | No | ≥2000 cycles |
| | 14 | rem | 5 | | 2.8 | 1 | | 202 | 218 | 50.1 | 30.0 | 29.5 | 17.1 | No | No | ≥1000 cycles |
| | 15 | rem | 5 | | 3.5 | 0.8 | | 202 | 218 | 52.1 | 31.2 | 34.2 | 25.3 | No | No | ≥2000 cycles |
| | 16 | rem | 5 | | 4 | 1 | | 202 | 225 | 50.1 | 30.0 | 34.2 | 20.1 | No | No | ≥2000 cycles |
| | 17 | rem | 4 | | 2.8 | 0.8 | | 202 | 227 | 48.5 | 26.3 | 25.1 | 17.5 | No | No | ≥1000 cycles |
| | 18 | rem | 5 | | 3 | 1 | 0.03 Ni | 202 | 220 | 48.0 | 38.5 | 32.4 | 23.9 | No | No | ≥2000 cycles |
| | 19 | rem | 5 | 0.5 | 3 | 1 | 0.01 Co | 202 | 217 | 40.8 | 35.8 | 30.1 | 21.6 | No | No | ≥2000 cycles |
| | 20 | rem | 5 | | 3 | 1 | 0.005 Fe | 202 | 217 | 48.6 | 38.0 | 32.9 | 23.4 | No | No | ≥2000 cycles |
| | 21 | rem | 5 | 1 | 3 | 1 | 0.0002 P | 202 | 217 | 42.6 | 36.3 | 33.1 | 22.0 | No | No | ≥2000 cycles |
| | 22 | rem | 5 | | 3 | 1 | 0.015 P | 202 | 217 | 43.2 | 37.4 | 31.1 | 23.0 | No | No | ≥2000 cycles |
| | 23 | rem | 5 | 0.5 | 3 | 1 | 0.005 Ge | 202 | 217 | 49.8 | 34.7 | 33.9 | 20.7 | No | No | ≥2000 cycles |
| | 24 | rem | 5 | | 3 | 1 | 0.2 Zn | 202 | 217 | 45.0 | 35.9 | 30.2 | 21.7 | No | No | ≥2000 cycles |
| | 25 | rem | 5 | 1 | 3 | 1 | 0.05 Zn | 202 | 217 | 40.8 | 35.8 | 31.2 | 21.6 | No | No | ≥2000 cycles |
| Comp. Ex. | 1 | rem | | | 3 | 0.5 | | 217 | 220 | 16.2 | 13.7 | | | No | No | poor RHC[1] |
| | 2 | rem | | | 3 | 1 | | 217 | 230 | 25.2 | 13.0 | | | No | No | poor RHC |
| | 3 | rem | 4 | | 2.5 | 0.5 | | 206 | 216 | 31.2 | 17.5 | | | No | No | poor RHC |
| | 4 | rem | 4 | | 4.5 | 0.5 | | 206 | 242 | 43.5 | 25.9 | | | No | No | high liquidus T |
| | 5 | rem | 5 | | 2.5 | 0.5 | | 204 | 215 | 33.0 | 18.9 | | | No | No | poor RHC |
| | 6 | rem | 1.5 | 3 | 3 | 0.2 | | 192 | 214 | 31.5 | 16.9 | | | No | Yes | poor RHC |
| | 7 | rem | 2 | | 3 | 0 | | 212 | 216 | 18.8 | 11.7 | | | No | Yes | poor RHC |
| | 8 | rem | 2 | 3 | 3 | 0.2 | | 184 | 212 | 30.8 | 15.6 | | | No | Yes | poor RHC |
| | 9 | rem | 2 | 5 | 3 | 0.2 | | 182 | 210 | 21.0 | 13.0 | | | No | Yes | poor RHC |
| | 10 | rem | 3 | 1.5 | 3 | 0.2 | | 198 | 212 | 26.6 | 16.9 | | | No | Yes | poor RHC |
| | 11 | rem | 3 | 1 | 3.5 | | | 206 | 213 | 24.5 | 14.3 | | | No | Yes | poor RHC |
| | 12 | rem | 3 | 2 | 3.5 | | | 195 | 211 | 27.3 | 19.5 | | | No | Yes | poor RHC |
| | 13 | rem | 3 | 4 | 3.5 | | | 164 | 210 | 19.6 | 12.4 | | | No | Yes | poor RHC |
| | 14 | rem | 3 | 6 | 3.5 | | | 170 | 205 | 17.5 | 9.8 | | | No | Yes | poor RHC |
| | 15 | rem | 4 | 4.5 | 3.2 | | | 172 | 206 | 17.5 | 11.7 | | | No | Yes | poor RHC |
| | 16 | rem | 4 | 4 | 3.5 | | | 175 | 208 | 20.3 | 10.4 | | | No | Yes | poor RHC |
| | 17 | rem | 4.8 | | 3.3 | | | 204 | 217 | 31.5 | 18.9 | | | No | Yes | poor RHC |
| | 18 | rem | 5 | | 3.5 | | | 203 | 216 | 30.8 | 18.2 | | | No | Yes | poor RHC |
| | 19 | rem | 5 | 2 | 3.5 | | | 192 | 206 | 21.0 | 13.0 | | | No | Yes | poor RHC |
| | 20 | rem | 5 | 4 | 3.5 | | | 178 | 205 | 17.5 | 9.8 | | | No | Yes | poor RHC |
| | 21 | rem | 5 | 6 | 3.5 | | | 158 | 198 | 14.0 | 7.8 | | | No | Yes | poor RHC |
| | 22 | rem | 5.8 | 2 | 3.5 | 0.1 | | 190 | 206 | 20.3 | 9.8 | | | No | Yes | poor RHC |
| | 23 | rem | 6 | | 3.5 | | | 204 | 209 | 30.1 | 16.3 | | | Yes | Yes | poor RHC |

TABLE 1-continued

| | | Alloy composition (mass %) | | | | | m.p. (° C.) *1 | | Bonding strength after heat cycle test (N) *2 | | | | Solder deformation | Cu erosion | |
|---|---|---|---|---|---|---|---|---|---|---|---|---|---|---|---|
| | | | | | | | Solidus | Liquidus | 1000 cycles | | 2000 cycles | | | | |
| | Sn | In | Bi | Ag | Cu | Other | Temp. | Temp. | Av. | Min. | Av. | Min. | *3 | *4 | Remarks |
| 24 | rem | 6 | 3 | 3.5 | | | 180 | 205 | 18.2 | 9.8 | | | Yes | Yes | poor RHC |
| 25 | rem | 7 | 2 | 3 | 0.2 | | 187 | 205 | 19.6 | 9.1 | | | Yes | Yes | poor RHC |
| 26 | rem | 8 | | 3.5 | | | 196 | 207 | 30.1 | 18.2 | | | Yes | Yes | poor RHC |
| 27 | rem | 8.3 | 2 | 3 | | | 182 | 204 | 17.5 | 10.4 | | | Yes | Yes | poor RHC |

[1]RHC = Resistance to Heat Cycles

In these examples, measurement of the melting point, a heat cycle test, a deformation test, and a Cu erosion test were carried out on each alloy in the following manner.

Melting Point Measurement (*1):

The solidus temperature and liquidus temperature of an alloy were measured using a differential scanning calorimeter (DSC). The rate of temperature increase of the differential scanning calorimeter was 5° C. per minute, and the sample weight was 15 grams.

Taking into consideration thermal effects on electronic parts and printed circuit boards during soldering, the liquidus temperature is preferably 230° C. or lower. In order not to reduce the bonding strength of solder at a high temperature, the solidus temperature should be at least 190° C.

Heat Cycle Test (*2):

Chip resistor parts measuring 3.2×1.6×0.6 mm were soldered to patterned portions to be soldered each measuring 1:6×1.2 mm provided on a six-layer printed circuit board (glass epoxy substrate) having a thickness of 1.6 mm. Soldering was carried out by printing solder paste to a thickness of 150 μm on the patterned portions to be soldered followed by heating in a reflow furnace with a peak temperature of 245° C.

The solder paste was prepared by forming solder powder having an average particle diameter of 30 μm from each of the solder alloys shown in Table 1 and mixing it with a flux having the following composition.

The compositions of the solder paste and the flux were as follows:

Solder powder: 89 mass %,
Flux: 11 mass %.
Flux composition:
55 mass % of polymerized rosin,
7 mass % of hydrogenated castor oil,
1 mass % of diphenylguanidine HBr, and
37 mass % of diethylene glycol monohexyl ether.

Chip resistor parts measuring 3.2×1.6×0.6 mm were soldered to patterned portions to be soldered each measuring 1.6×1.2 mm provided on a six-layer FR-4 glass epoxy substrate measuring 1500 mm×1400 mm and having a thickness of 1.6 mm. After the solder paste was printed on the electrode portions of the substrate using a metal mask with a thickness of 150 μm, soldering was carried out by heating the substrate in a reflow furnace set to a peak temperature of 245° C. The resulting printed circuit board (substrate) having the chip resistor parts mounted thereon was then placed into a heat cycle tester set so as to maintain a temperature of −55° C. and 150° C. for 30 minutes at each temperature, and a substrate which was repeatedly exposed to this heat cycle environment for 1000 cycles and 2000 cycles was used as a test specimen. The chip resistor parts of the test specimen were peeled off using a shear strength tester at a shear rate of 5 mm per minute, and the peeling strength (N: Newton) at this time was measured. Testing was performed on 15-20 test specimens.

The results are shown in Table 1. The data in Table 1 are the average value and the minimum value for the 15-20 specimens.

In a heat cycle test, the bonding strength decreases primarily due to the formation of cracks. The more severe is the propagation of cracks, the lower is the bonding strength. In this heat cycle test, if the cracks completely pass through a soldered joint, the bonding (peeling) strength of the joint becomes 10 N or less. In a heat cycle test for 1000 cycles, if the average value of the bonding strength is at least 30 N and the minimum value thereof is at least 20 N, cracks do not completely pass through the joints, and the bonding strength is sufficient from a reliability standpoint. It is possible to guarantee reliability over a still longer period if the average value of the bonding strength is at least 30 N and the minimum value thereof is at least 20 N under more severe conditions of 2000 cycles.

Deformation Test (*3):

Each alloy of the given composition was rolled to a thickness of 0.1-0.2 mm and cut to a size of approximately 5×10 mm. The cut alloy piece was secured atop a copper plate at both of its ends with double-sided tape to use as a test specimen. After the test specimen was subjected to a heat cycle test in which it is maintained for 1000 cycles at −55° C. and +150° C. for 30 minutes at each temperature, the degree of deformation of solder was visually evaluated. The case in which the solder did not deform or in which only fine irregularities developed in the surface was evaluated as "no deformation", and the case in which the solder itself bent or the entirety of the solder blackened and did not maintain its original shape was evaluated as "deformed" ("yes" in the table).

Cu Erosion (*4).

Each alloy was charged into a small wave soldering bath with a capacity of 15 kg and heated at 260° C. to melt. The wave height from the nozzle of the wave soldering bath was then adjusted to be 5 mm.

The test specimen used in this test was an FR4 glass epoxy substrate which had copper wiring with a thickness of 35 μm and which was cut to a suitable size.

The test method comprised applying a pre-flux to the surface of the copper wiring of the test specimen and preheating the specimen for approximately 60 seconds to bring the temperature of the specimen to approximately 120° C. The test specimen was then immersed for 3 seconds in the spouting molten solder by placing it 2 mm above the nozzle of the wave soldering bath. This process was performed repeatedly, and the number of times immersion was carried out until the dimension (thickness) of the copper wiring on the test specimen was reduced by half was measured. From the standpoint of the reliability of vehicle-mounted electronic circuits, it should be possible to carry out immersion at least four times without the wiring decreasing in dimension by half. Those specimens which did not decrease by half in dimension after immersion four times were evaluated as "no", and those which decreased in dimension by half in three or fewer immersions were evaluated as "yes".

As can be seen from the results shown in Table 1, a lead-free solder according to the present invention not only has excellent resistance to heat cycles, but deformation of the solder does not occur. In addition, a lead-free solder according to the present invention has a solidus temperature of at least 190° C., so even if a vehicle-mounted electronic circuit which is soldered with a lead-free solder according to the present invention is installed in the vicinity of the hood of a vehicle, peeling does not readily take place at a high temperature. Furthermore, as it has a liquidus temperature of at most 240° C., electronic parts and printed circuit boards do not undergo thermal damage during soldering. In contrast, with the comparative examples of lead-free solders which are thought to have excellent resistance to heat cycles, the resistance to heat cycles demanded of vehicle-mounted electronic circuits could not be obtained, or the solidus temperature or the liquidus to temperature was too low or too high, or the solder underwent deformation in a heat cycle environment and there was a concern of the occurrence of bridging after soldering Therefore, those solders were not suitable for soldering of vehicle-mounted electronic circuits.

The invention claimed is:

1. A vehicle-mounted electronic circuit mounted in a vicinity of an engine of a vehicle in a location where the temperature reaches at least 100° C. during operation of the engine, the circuit having a soldered joint formed from a lead-free solder consisting of Ag: 2.8-3.5 mass %, In: 3.0-4.0 mass %, Cu: 0.5-1.0 mass %, Bi: 1.5-3 mass %, optionally at least one of Ni, Fe, and Co in a total amount of 0.005-0.05 mass %, optionally at least one of P and Ge in a total amount of 0.0002-0.02 mass %, optionally greater than 0 to at most 1 mass % of Zn, and a remainder of Sn, wherein when a lead-free solder paste made from the solder is applied by printing to a thickness of 150 μm to patterned portions measuring 1.6×1.2 mm of a printed circuit board, chip resistor parts measuring 3.2×1.6×0.6 mm are mounted on the solder paste, the chip resistor parts and the printed circuit board are heated in a reflow furnace with a peak temperature of 245° C. to solder the chip resistor parts to the patterned portions, and then the printed circuit board and the chip resistor parts are subjected to a heat cycle test comprising 1000 cycles of holding for 30 minutes at −55° and +150° C. at each temperature, the chip resistor parts have a minimum peel strength of at least 20 N.

2. A vehicle-mounted electronic circuit as claimed in claim 1 wherein the lead-free solder contains at least one of Ni, Fe, and Co in a total amount of 0.005-0.05 mass %.

3. A vehicle-mounted electronic circuit as claimed in claim 1 wherein the lead-free solder contains at least one of P and Ge in a total amount of 0.0002-0.02 mass %.

4. A vehicle-mounted electronic circuit as claimed in claim 1 wherein the lead-free solder contains greater than 0 to at most 1 mass % of Zn.

5. A vehicle-mounted electronic circuit as claimed in claim 2 wherein the lead-free solder contains at least one of P and Ge in a total amount of 0.0002-0.02 mass %.

6. A vehicle-mounted electronic circuit as claimed in claim 5 wherein the lead-free solder contains greater than 0 to at most 1 mass % of Zn.

7. A vehicle-mounted electronic circuit as claimed in claim 1 selected from a power module and a hybrid semiconductor circuit.

8. An automotive vehicle having an electronic circuit as claimed in claim 1 mounted thereon in a vicinity of an engine of the vehicle in a location where the temperature reaches at least 100° C. during operation of the engine.

9. A vehicle-mounted electronic circuit as claimed in claim 1 wherein the lead-free solder has a solidus temperature of at least 190° C. and a liquidus temperature of at most 240° C.

10. A vehicle-mounted electronic circuit as claimed in claim 1 wherein the chip resistor parts have a minimum peel strength of at least 20 N after 2000 cycles in a heat cycle test.

* * * * *